(12) United States Patent
Trandal et al.

(10) Patent No.: US 10,677,273 B2
(45) Date of Patent: Jun. 9, 2020

(54) SUBSEA ARRANGEMENT AND METHOD FOR DETECTING A MALFUNCTION OF A SUBSEA ARRANGEMENT

(71) Applicant: ABB Schweiz AG, Baden (CH)

(72) Inventors: Arne Trandal, Ålesund (NO); Markku Launonen, Vaasa (FI)

(73) Assignee: ABB Schweiz AG, Baden (CH)

( * ) Notice: Subject to any disclaimer, the term of this patent is extended or adjusted under 35 U.S.C. 154(b) by 271 days.

(21) Appl. No.: 15/878,045

(22) Filed: Jan. 23, 2018

(65) Prior Publication Data

US 2018/0313372 A1 Nov. 1, 2018

(30) Foreign Application Priority Data

Apr. 26, 2017 (EP) .................................... 17168191

(51) Int. Cl.
- F15B 21/00 (2006.01)
- H05K 7/20 (2006.01)
- G01M 3/02 (2006.01)
- G01M 3/26 (2006.01)
- E21B 41/00 (2006.01)

(52) U.S. Cl.
CPC ........ F15B 21/006 (2013.01); E21B 41/0007 (2013.01); G01M 3/027 (2013.01); G01M 3/26 (2013.01); H05K 7/20236 (2013.01); H05K 7/20927 (2013.01)

(58) Field of Classification Search
CPC .... F15B 21/006; E21B 41/007; G01M 3/027; G01M 3/26; H05K 7/20236; H05K 7/20927

USPC .............................................................. 73/40
See application file for complete search history.

(56) References Cited

U.S. PATENT DOCUMENTS

| 6,805,145 | B2 | 10/2004 | Ottestad |
| 8,251,614 | B2* | 8/2012 | Karstad .................... B63G 8/08 405/193 |
| 8,714,176 | B2 | 5/2014 | Kerr et al. |
| 2013/0167962 | A1 | 7/2013 | Skjetne et al. |
| 2014/0048163 | A1* | 2/2014 | Brekke ................. G01L 9/0076 138/30 |

(Continued)

FOREIGN PATENT DOCUMENTS

| DE | 10127276 A1 * | 1/2003 | ............. H01F 27/02 |
| DE | 10127276 A1 | 1/2003 | |

(Continued)

OTHER PUBLICATIONS

Translation of EP-2925102-A1 (in English) (Year: 2015).*

(Continued)

*Primary Examiner* — Nathaniel T Woodward
(74) *Attorney, Agent, or Firm* — Whitmyer IP Group LLC

(57) ABSTRACT

A subsea arrangement including a main enclosure having a main enclosure volume; at least one main pressure compensator having a variable compensation volume in fluid communication with the main enclosure volume and configured to compensate volume variations of an internal fluid in the main enclosure volume; and at least one pressure sensor arranged to measure a pressure of the internal fluid. A method for detecting a malfunction of a subsea arrangement including a main enclosure having a main enclosure volume and at least one main pressure compensator is also provided.

18 Claims, 5 Drawing Sheets

(56) References Cited

U.S. PATENT DOCUMENTS

| | | |
|---|---|---|
| 2015/0188297 A1 | 7/2015 | Boe et al. |
| 2016/0215913 A1* | 7/2016 | Knoener ............. E21B 33/0355 |
| 2016/0239027 A1* | 8/2016 | Klingsheim .......... E21B 33/038 |

FOREIGN PATENT DOCUMENTS

| | | | |
|---|---|---|---|
| EP | 2925102 A1 * | 9/2015 | ............. H05K 5/068 |
| EP | 2925102 A1 | 9/2015 | |
| EP | 3057111 A1 | 8/2016 | |

OTHER PUBLICATIONS

Translation of DE-10127276-A1 (Year: 2003).*
European Search Report Application No. 17168191.9 Completed: Jun. 30, 2017; dated Jul. 31, 2017 8 Pages.

* cited by examiner

SUBSEA ARRANGEMENT AND METHOD FOR DETECTING A MALFUNCTION OF A SUBSEA ARRANGEMENT

TECHNICAL FIELD

The present disclosure generally relates to pressure compensated subsea arrangements. In particular, a subsea arrangement comprising a main enclosure, at least one pressure compensator and at least one pressure sensor and a method for detecting a malfunction of a subsea arrangement are provided.

BACKGROUND

Subsea arrangements housing power equipment underwater, such as transformers or frequency converters, may comprise a vessel filled with insulation and/or cooling fluid to encounter for the high pressure due to deep water depth. During storing, submerging to sea bottom and operation of the arrangement, temperature and volume of the insulation and/or cooling fluid varies, whereby pressure compensation of the fluid is needed. This involves the use of a pressure compensator, which is in fluid connection with the vessel of the arrangement. The pressure compensator receives excess fluid when its temperature and volume increase, and returns the fluid back to the vessel when it cools down.

Leakage of seawater into the pressure compensator and/or into a main enclosure of the subsea arrangement is a serious risk as it may prevent the operation of the subsea arrangement or damage the same. In case of leakage, seawater will come in contact with the power equipment and cause a costly equipment failure.

One type of prior art solution for detecting a leakage in a pressure balanced oil filled enclosure is to visually inspect the compensator position by means of a remotely operated vehicle (ROV). If the compensator is not moving during pressure changes within the enclosure, this may be an indication of a leakage.

An alternative type of prior art solution for detecting a leakage is to monitor the compensator position by means of an optical sensor, proximity switches or a linear variable displacement transducer (LVDT).

U.S. Pat. No. 8,714,176 B2 discloses a protection system for a fluid compartment of variable volume. The protection system comprises a detection means for detecting when the volume of the fluid compartment is outside a predetermined acceptable limit. The detection means may comprise a proximity sensor.

EP 2925102 A1 discloses a method of detecting a failure in a pressure compensation system. A control unit may be adapted to determine the presence of a failure of first or second pressure compensators on the basis of a displacement measured with a first or second measuring unit. The first and second measuring units may comprise an inductive or an optical sensor to measure the displacement of the respective pressure compensator.

SUMMARY

Prior art solutions for monitoring the compensator position, e.g., by means of LVDT transducers, have several disadvantages, including poor reliability and the need for one sensor per compensator in case more than one pressure compensator is provided.

One object of the present disclosure is to provide a subsea arrangement that can detect a malfunction in a simple, reliable and cheap manner.

A more particular object of the present disclosure is to provide a subsea arrangement that can detect a leakage of one of several barriers of the subsea arrangement, e.g., of at least one pressure compensator, in a simple, reliable and cheap manner.

A further more particular object of the present disclosure is to provide a subsea arrangement that can detect a jamming of a pressure compensator, in particular a main pressure compensator comprising or constituted by a metal bellows, in a simple, reliable and cheap manner.

A still further object of the present disclosure is to provide a subsea arrangement that can make at least one of the above detections at an early stage of the malfunction.

A still further object of the present disclosure is to provide a subsea arrangement that can perform condition monitoring of one or more pressure compensators in a simple, reliable and cheap manner.

A still further object of the present disclosure is to provide a method for detecting a malfunction of a subsea arrangement solving at least one of the foregoing objects.

According to one aspect, there is provided a subsea arrangement comprising a main enclosure having a main enclosure volume; at least one main pressure compensator having a variable compensation volume in fluid communication with the main enclosure volume and configured to compensate volume variations of an internal fluid in the main enclosure volume; and at least one pressure sensor arranged to measure a pressure of the internal fluid.

The at least one main pressure compensator is configured to balance the pressure in the main enclosure to the pressure prevailing in an ambient fluid (e.g., seawater). The main enclosure thus constitutes a pressurized or pressure compensated enclosure or vessel. A slight overpressure with respect to the ambient fluid may be provided in the main enclosure. In this way, the risk for ambient fluid entering the main enclosure volume is further reduced. The overpressure in the main enclosure may for example be accomplished by means of one or more springs exerting a biasing force on the main pressure compensator.

The internal fluid in the main enclosure volume (and in the compensation volume) may be constituted by a cooling liquid and/or a dielectric liquid, e.g., a dielectric oil. The subsea arrangement according to the present disclosure may be used for a wide range of subsea implementation. As one example, the subsea arrangement may be used in subsea oil and gas extraction. A further possible implementation is subsea mining.

The provision of at least one pressure sensor for measuring a pressure of the internal fluid enables a simple detection of a malfunction of the subsea arrangement, such as a leakage of internal fluid and/or a malfunction of a pressure compensator. The pressure measurements from the at least one pressure sensor can be used to monitor the condition of the barriers of the subsea arrangement, e.g., a metal bellows of the main pressure compensator. Throughout the present disclosure, a pressure sensor arranged to measure a pressure of the internal fluid may be referred to as an internal pressure sensor.

The subsea arrangement may further comprise power equipment housed within the main enclosure. Examples of power equipment include transformers, switchgears, variable speed drives (VSD), high voltage conductors and combinations thereof.

The subsea arrangement may further comprise a control system configured to detect a malfunction of the subsea arrangement based on a deviation of the pressure of the internal fluid measured by the at least one pressure sensor from a normal pressure profile. The normal pressure profile may for example be predefined and/or calculated. The normal pressure profile may include the normal pressure fluctuations of the internal fluid caused by compression and expansion of the main pressure compensator (e.g., when the power equipment goes from a cold state to a hot state, and vice versa) during normal operation of the subsea arrangement. The control system may continuously read the pressures from the at least one pressure sensor.

The control system may also be configured to categorize the type of malfunction based on the abnormal pressure measurements of the internal fluid. For example, by knowing the spring constant of an outer barrier of the main pressure compensator and the spring constant of a bladder in a termination pressure compensator (e.g., bottle compensator), it can be determined based on the abnormal pressure measurements of the internal fluid whether a leakage occurs from the compensation volume into an intermediate volume of the main pressure compensator or whether a leakage occurs from the main enclosure volume into a termination enclosure, or both. The spring constant of a termination pressure compensator is typically significantly lower than the spring constant of a main pressure compensator. The spring constant of the main pressure compensator also depends on the pressure of the ambient fluid, e.g., on which water depth the subsea arrangement is positioned. The spring constant of the termination pressure compensator may be very small and substantially independent of the pressure of the ambient fluid. The control system may be configured to calculate a displacement of the main pressure compensator based on the spring constant and the pressure of the internal fluid measured by the at least one pressure sensor.

In the case of a leakage or a jamming of the main pressure compensator, the behavior of the main pressure compensator will differ from the behavior during normal operation of the subsea arrangement. This will be reflected by a deviation of the internal fluid pressure from the normal pressure profile. In particular, when one of a few parallel main pressure compensators, or a sole main pressure compensator, jams, the internal fluid pressure will deviate significantly from the normal pressure profile. The deviation depends on the compensation need and the mechanical strength of the main pressure compensator.

The control system may be configured to define the normal pressure profile based on historical data of the pressure of the internal fluid during normal operation of the subsea arrangement. Thereby, the normal pressure profile can be accurately defined for a specific installation of the subsea arrangement. Alternatively, the control system may be configured to calculate the normal pressure profile based on at least one parameter of the subsea arrangement during normal operation of the subsea arrangement. The at least one parameter of the subsea arrangement may for example be constituted by a temperature of power equipment housed within the main enclosure or by a power supplied to the power equipment. As a further alternative, the control system may be configured to define the normal pressure profile based on a combination of the historical data and the at least one parameter of the subsea arrangement during normal operation of the subsea arrangement. Particularly this further alternative variant may be combined with a differential pressure sensor arranged to measure a pressure differential between the internal fluid in the main enclosure volume and the ambient fluid.

Each of the at least one main pressure compensator may comprise two or more barriers. Thereby, the power equipment can withstand breach of one barrier for a limited time without failing.

The main pressure compensator may comprise an inner barrier defining the compensation volume and an outer barrier defining an intermediate volume between the inner barrier and the outer barrier. The intermediate volume may be filled with the same type of internal fluid as in the main enclosure volume and in the compensation volume, i.e., a dielectric liquid such as dielectric oil. Alternatively, the intermediate volume and the compensation volume may respectively be filled with different types of dielectric insulation fluids.

The control system may be configured to detect a leakage of the internal fluid from the compensation volume to the intermediate volume based on the deviation of the pressure of the internal fluid measured by the at least one pressure sensor from the normal pressure profile. Alternatively, or in addition, the control system may be configured to detect jamming of the main pressure compensator based on the deviation of the pressure of the internal fluid measured by the at least one pressure sensor from the normal pressure profile.

The subsea arrangement may further comprise a termination enclosure adjacent to the main enclosure, the termination enclosure having a termination volume and at least one termination pressure compensator in fluid communication with the termination volume and being configured to compensate volume variations of an internal fluid in the termination volume. The termination volume may be filled with the same type of internal fluid as in the main enclosure volume and in the compensation volume, i.e., a dielectric liquid such as a dielectric oil.

The control system may further be configured to detect leakage of the internal fluid from the main enclosure volume to the termination volume based on the deviation of the pressure of the internal fluid measured by the at least one pressure sensor from the normal pressure profile. The at least one pressure sensor may be a differential pressure sensor arranged to measure a pressure differential between the internal fluid in the main enclosure volume and the internal fluid in the termination volume.

The at least one pressure sensor may be arranged to measure a pressure of the internal fluid during normal operation of the subsea arrangement. If the measured pressure profile substantially corresponds to an expected normal pressure profile, it may be concluded, e.g., by the control system, that the subsea arrangement operates normally, i.e., without any malfunction.

The at least one pressure sensor may be configured to measure an absolute pressure of the internal fluid. Alternatively, or in addition, the at least one pressure sensor may be positioned within the main enclosure volume or within the compensation volume.

According to one variant, the at least one pressure sensor is an internal pressure sensor and the subsea arrangement further comprises at least one external pressure sensor for measuring a pressure of an ambient fluid outside of the main enclosure. In this case, the internal pressure sensor and the external pressure sensor may be arranged to measure a differential pressure between the internal fluid and the ambient fluid.

Throughout the present disclosure, the at least one main pressure compensator may comprise or may be constituted by a metal bellows.

According to a further aspect, there is provided a method for detecting a malfunction of a subsea arrangement comprising a main enclosure having a main enclosure volume; and at least one main pressure compensator having a variable compensation volume in fluid communication with the main enclosure volume and configured to compensate volume variations of an internal fluid in the main enclosure volume. The method comprises measuring a pressure of the internal fluid; comparing the measured pressure of the internal fluid with a normal pressure profile; and determining a malfunction of the subsea arrangement if the measured pressure of the internal fluid deviates from the normal pressure profile.

The method may further comprise defining the normal pressure profile based on historical data of the pressure of the internal fluid during normal operation of the subsea arrangement. Alternatively, or in addition, the method may further comprise calculating the normal pressure profile based on at least one parameter of the subsea arrangement during normal operation of the subsea arrangement.

According to a further aspect, there is provided a computer program product comprising a computer readable means holding computer-executable components for causing a control system to perform any of the methods according to the present disclosure.

According to a further aspect, there is provided a computer program comprising computer program code which is able to, when run on processor circuitry of a control system, cause the control system to perform any of the methods according to the present disclosure.

BRIEF DESCRIPTION OF THE DRAWINGS

Further details, advantages and aspects of the present disclosure will become apparent from the following embodiments taken in conjunction with the drawings, wherein.

DETAILED DESCRIPTION

Figure 1:
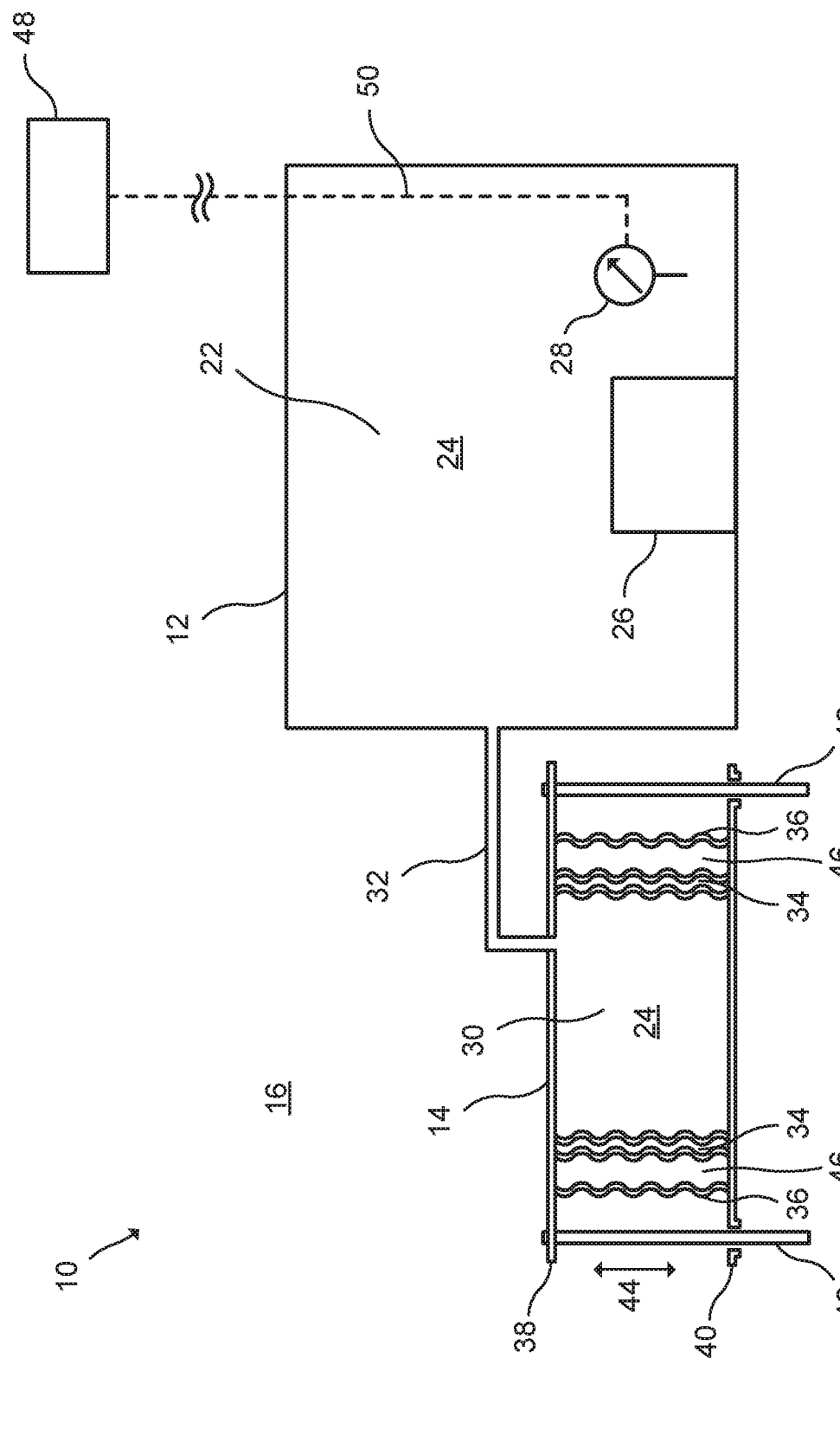
FIG. 1: schematically represents a side view of a subsea arrangement comprising a pressure sensor.

In the following, a subsea arrangement comprising a main enclosure, at least one pressure compensator and at least one pressure sensor and a method for detecting a malfunction of a subsea arrangement, will be described. The same reference numerals will be used to denote the same or similar structural features.

FIG. 1 schematically represents a side view of a subsea arrangement 10. The subsea arrangement 10 comprises a main enclosure 12 and a main pressure compensator 14. In this example, the subsea arrangement 10 comprises one main pressure compensator 14 but the subsea arrangement 10 may alternatively comprise several main pressure compensators 14. Throughout the present disclosure, the name main pressure compensator is used to distinguish pressure compensators having a higher compensation capacity in comparison with, for example a termination pressure compensator (see FIGS. 4 and 5).

The subsea arrangement 10 is submerged in an ambient fluid 16, e.g., seawater. FIG. 1 further indicates a vertical direction 18 and a horizontal direction 20.

The main enclosure 12 comprises a main enclosure volume 22. The main enclosure volume 22 may for example be constituted by one continuous chamber or by several chambers in fluid communication. The main enclosure volume 22 is filled with an internal fluid 24, such as a dielectric oil. Power equipment 26 is arranged within the main enclosure volume 22. Non limiting examples of power equipment 26 include transformers, switchgears, variable speed drives (VSD), high voltage conductors and combinations thereof. Heat from the power equipment 26 is absorbed by the internal fluid 24.

The subsea arrangement 10 further comprises at least one pressure sensor 28 arranged to measure a pressure of the internal fluid 24. The pressure sensor 28 of this example is an absolute pressure sensor arranged within the main enclosure volume 22.

The main pressure compensator 14 has a variable compensation volume 30 in fluid communication with the main enclosure volume 22. Thus, also the compensation volume 30 is filled with the internal fluid 24. The main pressure compensator 14 is configured to compensate for volume variations of the internal fluid 24, e.g., a volume expansion of the internal fluid 24 due to heating by the power equipment 26. The pressure sensor 28 may alternatively be arranged in the compensation volume 30.

In the example of FIG. 1, the fluid communication is realized by means of a pipe arrangement 32 between the main enclosure 12 and the main pressure compensator 14. The pipe arrangement 32 may be flexible and/or comprise flexible components to compensate for movements of the main pressure compensator 14.

The main pressure compensator 14 comprises an inner barrier 34 and an outer barrier 36. In the example of FIG. 1, the inner barrier 34 is constituted by a double wall metal bellows and the outer barrier 36 is constituted by a rubber bellows or rubber enclosure. The two walls of the inner barrier 34 may be made of flexible metal sheets and air with a pressure of approximately 1 bar may be provided between the two sheets. The outer barrier 36 may be provided with a strengthening material on its inside. The main pressure compensator 14 further comprises an upper end plate 38 and a lower end plate 40. The inner barrier 34, upper end plate 38 and the lower end plate 40 define the compensation volume 30 of the main pressure compensator 14.

The upper end plate 38 is guided up and down in the vertical direction 18 by means of guiding rods 42 as illustrated by arrows 44. A main pressure compensator 14 according to the present disclosure may however be of various different types.

A closed intermediate volume 46 is formed between the inner barrier 34 and the outer barrier 36. The intermediate volume 46 is also filled with the internal fluid 24. However, the intermediate volume 46 may alternatively be filled with another fluid or a vacuum may be established in the intermediate volume 46. Due to the elasticity of the outer barrier 36, the pressure of the internal fluid 24 within the intermediate volume 46 is substantially the same as the pressure of the ambient fluid 16 outside the main pressure compensator 14.

The subsea arrangement 10 further comprises a control system 48 configured to detect various types of malfunctions of the subsea arrangement 10 in accordance with the present disclosure. More specifically, the control system 48 is configured to detect a malfunction of the subsea arrangement 10 based on a deviation of the pressure of the internal fluid 24 measured by the pressure sensor 28 from a normal pressure profile.

A predefined normal pressure profile may be based on historical data of the pressure during normal (i.e., without malfunction) operation of the subsea arrangement 10. The historical pressure data may be collected during several weeks or several months after installation of the subsea arrangement 10. Temperatures of the ambient fluid 16 and/or supply current and voltage to the power equipment 26 may also be collected during the same period.

A normal pressure profile may alternatively be calculated based on at least one parameter of the subsea arrangement 10, for example based on the temperature of the internal fluid 24. Any given temperature of the internal fluid 24 will correspond to a given volume of the internal fluid 24 during normal operation of the subsea arrangement 10. The temperature of the internal fluid 24 may be measured directly, e.g., by means of one or more temperature sensors, or indirectly, e.g., based on the drive signals sent to the power equipment 26. The calculations of the normal pressure profile may be carried out in real time.

In the example of FIG. 1, the control system 48 is in signal communication with the pressure sensor 28 by means of a signal line 50. However, a wireless communication may alternatively be implemented.

The control system 48 may contain or may be loaded with a computer program product comprising a computer readable means holding computer-executable components for causing the control system 48 to perform methods according to the present disclosure. The computer program product may comprise a computer program comprising computer program code which, when run on a processor circuitry of the control system 48, causes the control system 48 to perform the methods.

During normal operation of the subsea arrangement 10, the main pressure compensator 14 is displaced, i.e., contracts and expands, according to the volume changes of the internal fluid 24. In this example, the lower end plate 40 of the main pressure compensator 14 is stationary and the displacement of the main pressure compensator 14 is effected by the movements of the upper end plate 38.

The functionality of the main pressure compensator 14 may be simplified as a spring where Hooke's law (F=k*X) apply. The constant k may be constituted by the spring constant of the main pressure compensator 14 and X is the displacement of the main pressure compensator 14. In this example, the displacement X is the displacement of the upper end plate 38 relative to the stationary lower end plate 40 in the vertical direction 18. However, the main pressure compensator 14 may have an alternative orientation in space and the displacement X of the main pressure compensator 14 may alternatively take place in the horizontal direction 20, or in any other direction.

When a volume change of the internal fluid 24 in the main enclosure volume 22 occurs, the upper end plate 38 of the main pressure compensator 14 will be subjected to the movement force F=p*A, where p is the internal pressure of the internal fluid 24 in the compensation volume 30 and A is the area of the upper end plate 38 within the inner barrier 34.

There is therefore a correlation between the position of the main pressure compensator 14 (given by the displacement X) and the pressure of the internal fluid 24, which is the same in the main enclosure volume 22 and in the compensation volume 30, during normal operation of the subsea arrangement 10. Thereby, the pressure of the internal fluid 24 can be utilized to detect a malfunction of the subsea arrangement 10, such as jamming or leakage of the main pressure compensator 14.

Figure 2:
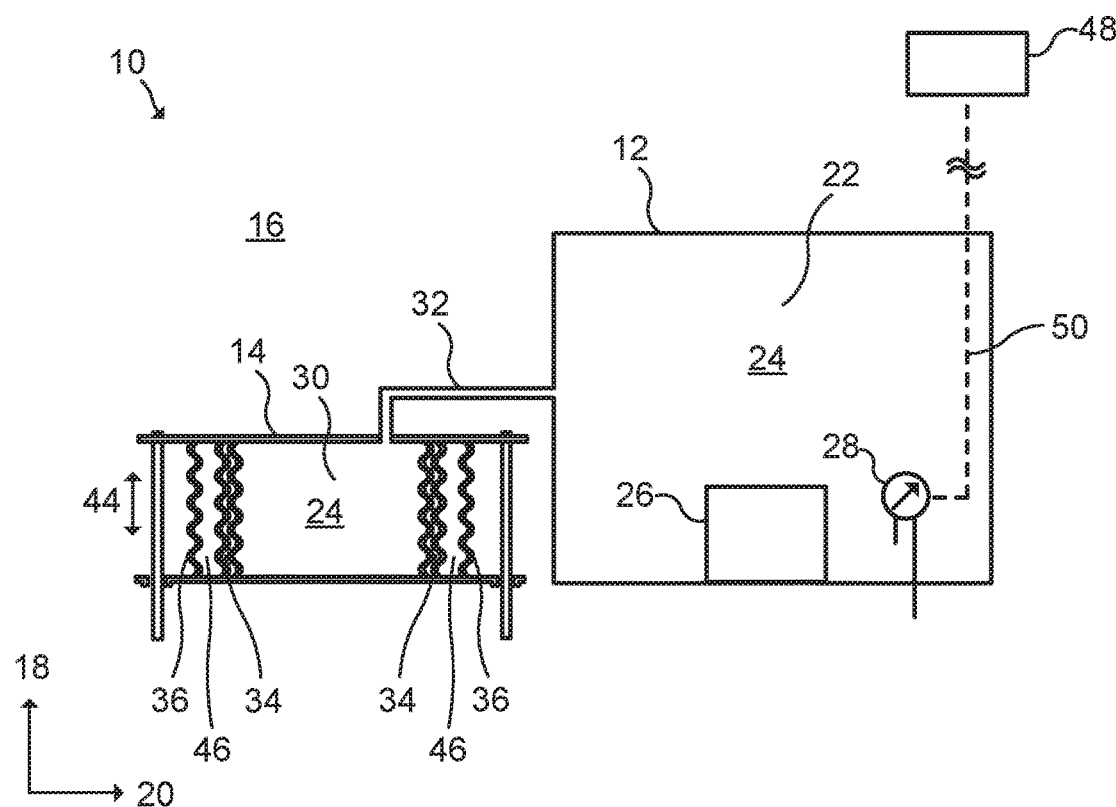
FIG. 2: schematically represents a side view of the subsea arrangement in FIG. 1 comprising an alternative pressure sensor.

FIG. 2 schematically represents a side view of the subsea arrangement 10 in FIG. 1 comprising an alternative pressure sensor 28. The pressure sensor 28 of this example is a differential pressure sensor 28 arranged to measure a differential pressure between the pressure of the internal fluid 24 in the main enclosure volume 22 and the pressure of the ambient fluid 16 outside the main enclosure 12. This differential pressure may be less than 1.0 bar. Measuring a differential pressure may be preferred when the variations of the differential pressure are small and/or when the pressure of the ambient fluid 16 varies due to winds, waves, tides etc.

Figure 3:
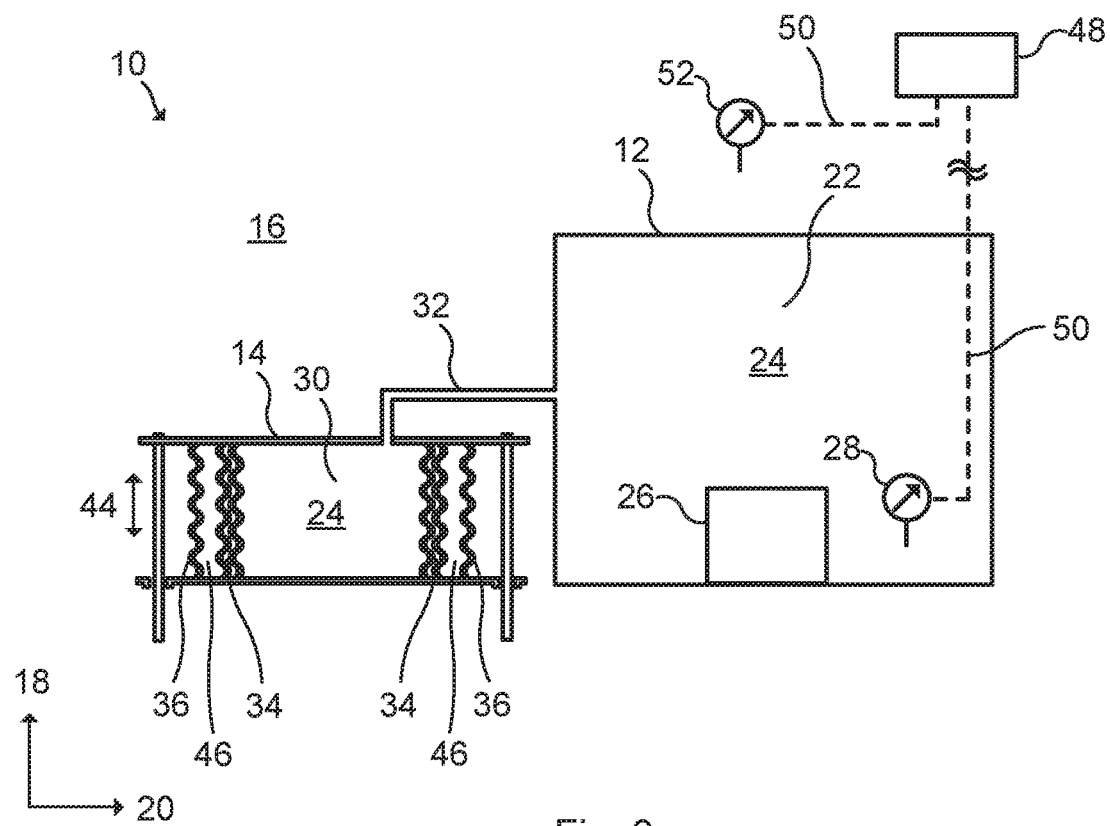
FIG. 3: schematically represents a side view of the subsea arrangement in FIGS. 1 and 2 comprising two pressure sensors.

FIG. 3 schematically represents a side view of the subsea arrangement 10 in FIGS. 1 and 2 comprising two pressure sensors 28, 52. The pressure sensor 28 is an internal pressure sensor arranged within the main enclosure volume 22 to measure the pressure of the internal fluid 24. The pressure sensor 52 is an external pressure sensor arranged outside the main enclosure 12 to measure the pressure of the ambient fluid 16 surrounding the main enclosure 12. Each of the two pressure sensors 28, 52 of this example is an absolute pressure sensor.

Figure 4:
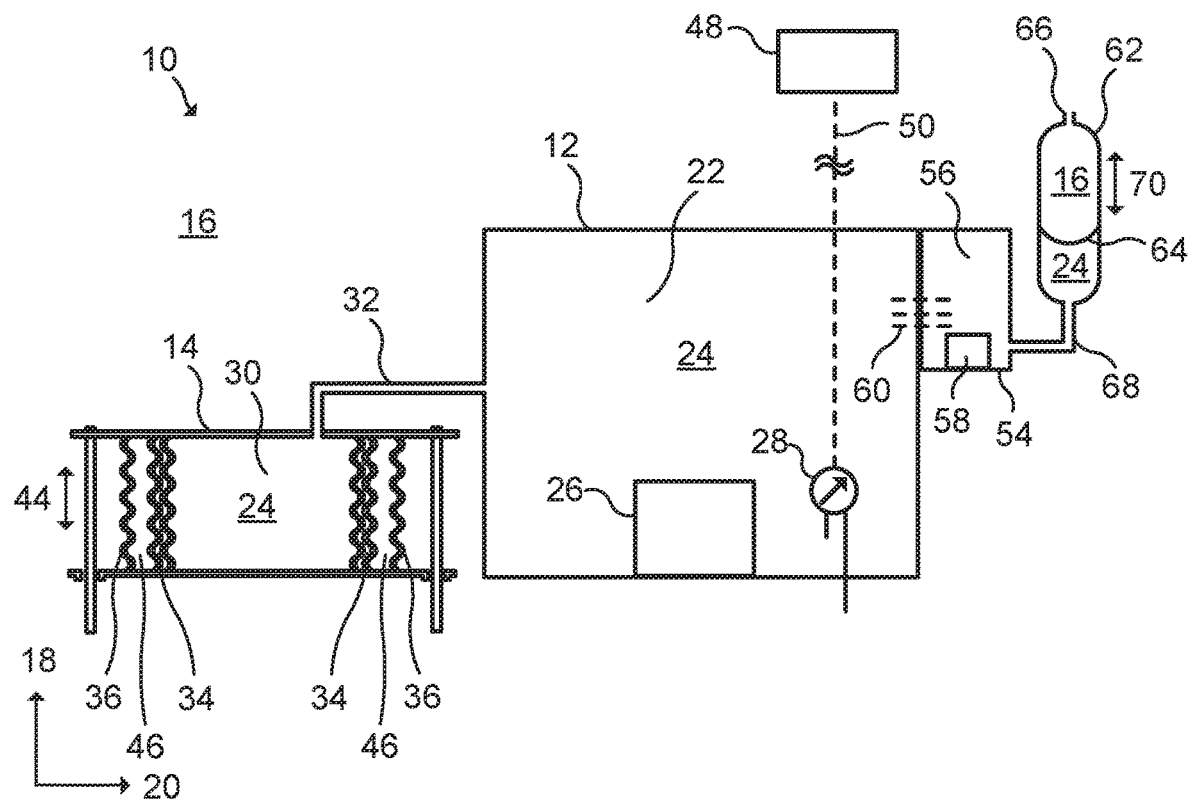
FIG. 4: schematically represents a side view of an alternative subsea arrangement comprising a pressure sensor.

FIG. 4 schematically represents a side view of an alternative subsea arrangement 10 comprising a pressure sensor 28. The pressure sensor 28 of this example is a differential pressure sensor 28 arranged to measure a differential pressure between the pressure of the internal fluid 24 in the main enclosure volume 22 and the pressure of the ambient fluid 16 outside the main enclosure 12.

The subsea arrangement 10 in FIG. 4 further comprises a termination enclosure 54. The termination enclosure 54 comprises a termination volume 56 containing an internal fluid 24 and power equipment 58 housed therein. Also the internal fluid 24 in the termination volume 56 may be constituted by a dielectric oil. The power equipment 58 in the termination volume 56 may for example be one or more switching devices and cables 60 and/or miscellaneous feedthroughs may communicate between the termination volume 56 and the main enclosure volume 22.

The termination volume 56 and the main enclosure volume 22 are hermetically sealed by a barrier during normal operation of the subsea arrangement 10. The barrier may for example be constituted by the parts of the respective walls of the main enclosure 12 and the termination enclosure 54 facing each other.

The subsea arrangement 10 in FIG. 4 further comprises a termination pressure compensator 62 associated with the termination enclosure 54. In FIG. 4, only one termination pressure compensator 62 is provided but the subsea arrangement 10 may alternatively comprise several termination pressure compensators 62.

The termination pressure compensator 62 of this example is constituted by a bottle compensator comprising a bladder 64. One side of the bladder 64 is in contact with the ambient fluid 16 and the other side of the bladder 64 is in contact with the internal fluid 24. The ambient fluid 16 is received in the termination pressure compensator 62, for example via an opening 66. The internal fluid 24 in the termination pressure compensator 62 is in fluid communication with the internal fluid 24 in the termination volume 56, for example via a pipe arrangement 68. During normal operation of the subsea arrangement 10, the termination pressure compensator 62 handles or compensates volume variations of the internal fluid 24 in the termination volume 56, e.g., due to temperature variations of the power equipment 58, and the bladder 64 moves back and forth as indicated by arrow 70.

The spring constant of the bladder 64 may be very small and cause very small pressure differences between the internal fluid 24 and the ambient fluid 16. Larger pressure differences may however occur if the internal fluid 24 is trapped in the termination pressure compensator 62. To make the flow of internal fluid 24 more reliable, extra pipes may be added to the termination pressure compensator 62, as described in EP 2704162 B1.

In case of a malfunction of the subsea arrangement 10 in the form of leakage between the main enclosure volume 22 and the termination volume 56, the internal fluid 24 will flow into the termination volume 56. Since the termination pressure compensator 62 has a lower spring constant than the spring constant of the main pressure compensator 14, volume variations of the internal fluid 24 in the compensation volume 30, in the main enclosure volume 22 and in the termination volume 56 will be absorbed by the termination pressure compensator 62, and not by the main pressure compensator 14. If this type of malfunction occurs, the main pressure compensator 14, which absorbs volume variations of the internal fluid 24 in the compensation volume 30 and in the main enclosure volume 22 during normal operation of the subsea arrangement 10, will stop moving or will behave differently since the termination pressure compensator 62 can absorb some of the volume changes of the internal fluid 24, but not all.

The control system 48 is configured to detect the leakage of internal fluid 24 from the main enclosure volume 22 to the termination volume 56 based on a deviation of the pressure of the internal fluid 24 from the normal pressure profile during normal operation of the subsea arrangement 10. For example, by deriving a spring constant from the pressure of the internal fluid 24, the control system 48 can conclude whether, for example, the inner barrier 34, the outer barrier 36 and/or the bladder 64 is "active" and consequently where a leak or malfunction may be present. In order to make this conclusion, the control system 48 may take into account the pressure of the ambient fluid 16.

Figure 5:
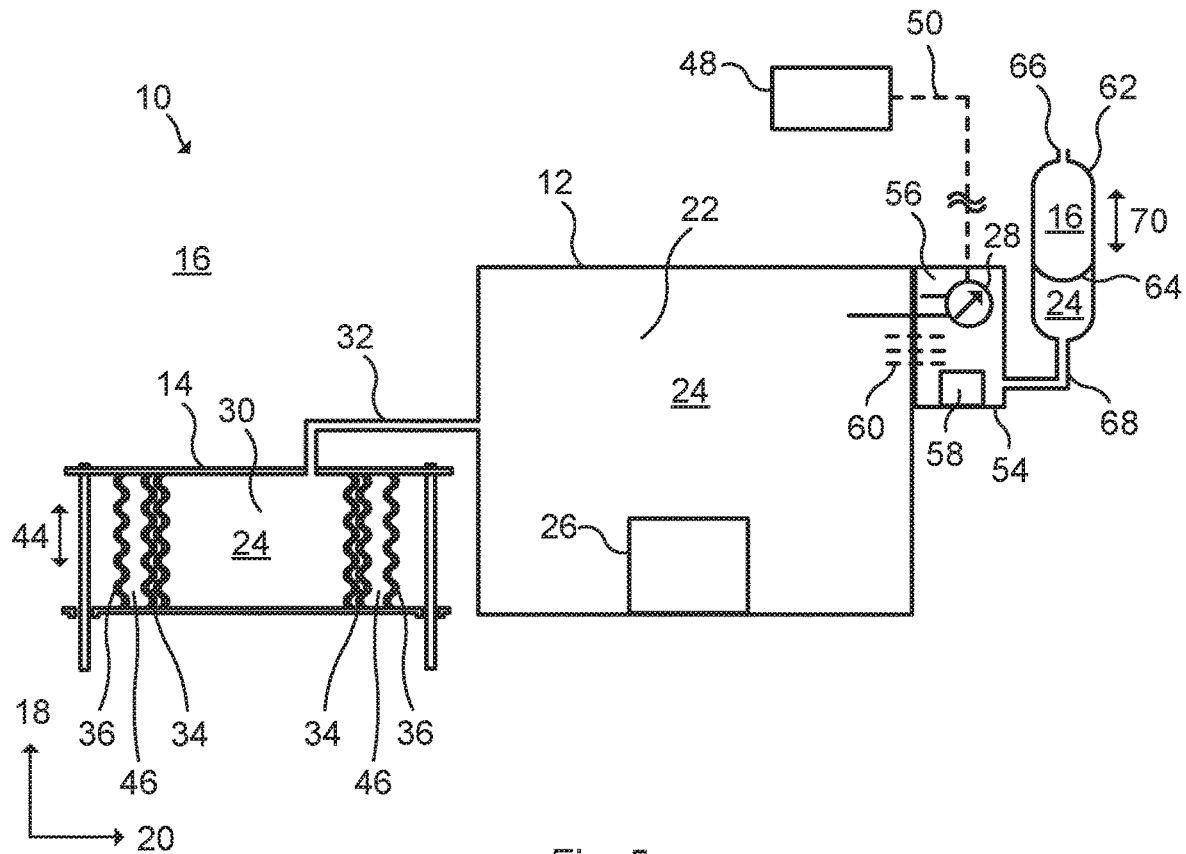
FIG. 5: schematically represents a side view of the subsea arrangement in FIG. 4 comprising an alternative pressure sensor.

FIG. 5 schematically represents a side view of the subsea arrangement 10 in FIG. 4 comprising an alternative pressure sensor 28. The pressure sensor 28 of this example is a differential pressure sensor 28 arranged to measure a differential pressure between the pressure of the internal fluid 24 in the main enclosure volume 22 and the pressure of the internal fluid 24 in the termination volume 56.

Figure 6:
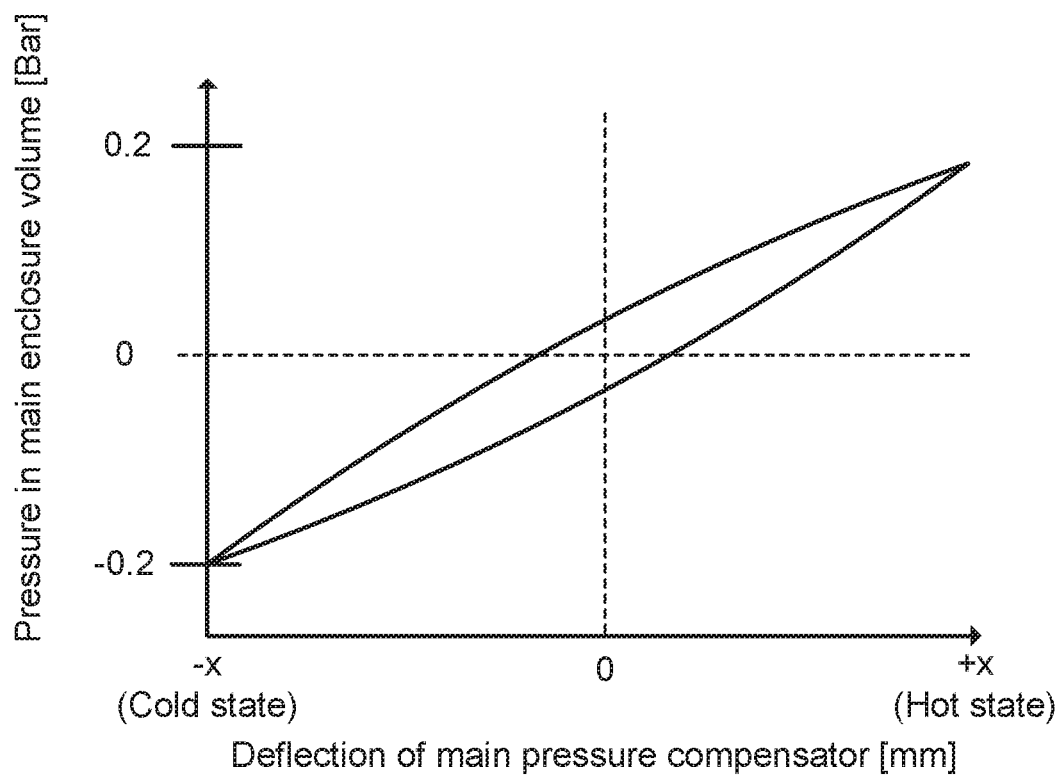
FIG. 6: schematically represents a graph of a typical normal pressure profile of an internal fluid in an enclosure volume as a function of compensator deflection between a cold state and a hot state of power equipment.

FIG. 6 schematically represents a graph of a typical normal pressure profile of the internal fluid 24 in the main enclosure volume 22 and in the compensation volume 30 as a function of the deflection of the main pressure compensator 14 between a cold state (smaller fluid volume) and a hot state (larger fluid volume) of the power equipment 26 during normal operation of the subsea arrangement 10. In the example of FIG. 6, a differential pressure between the pressure of the internal fluid 24 in the main enclosure volume 22 and in the compensation volume 30 and the pressure of the ambient fluid 16 outside the subsea arrangement 10 is shown. It is emphasized that the pressure values are merely examples and do not limit the present disclosure. The upper curve in FIG. 6 shows the pressure of the internal fluid 24 when the compensation volume 30 expands and the lower curve in FIG. 6 shows the pressure of the internal fluid 24 when the compensation volume 30 contracts.

The slope of the curve in FIG. 6 depends on the spring constant of the main pressure compensator 14. The spring constant of the main pressure compensator 14 in turn depends on the hydrostatic pressure, e.g., the sea depth. The subsea arrangement 10 may for example be installed at a depth of more than 1000 meters, e.g. 3000 meters. By knowing the spring constant of the main pressure compensator 14 and the hydrostatic pressure, it is possible to detect a leak in the main pressure compensator 14, e.g., a leak in the inner barrier 34.

The curve in FIG. 6 also contains hysteresis effects of the main pressure compensator 14. The hysteresis depends on the hydrostatic pressure and the deflection amplitudes (max and min).

Figure 7:
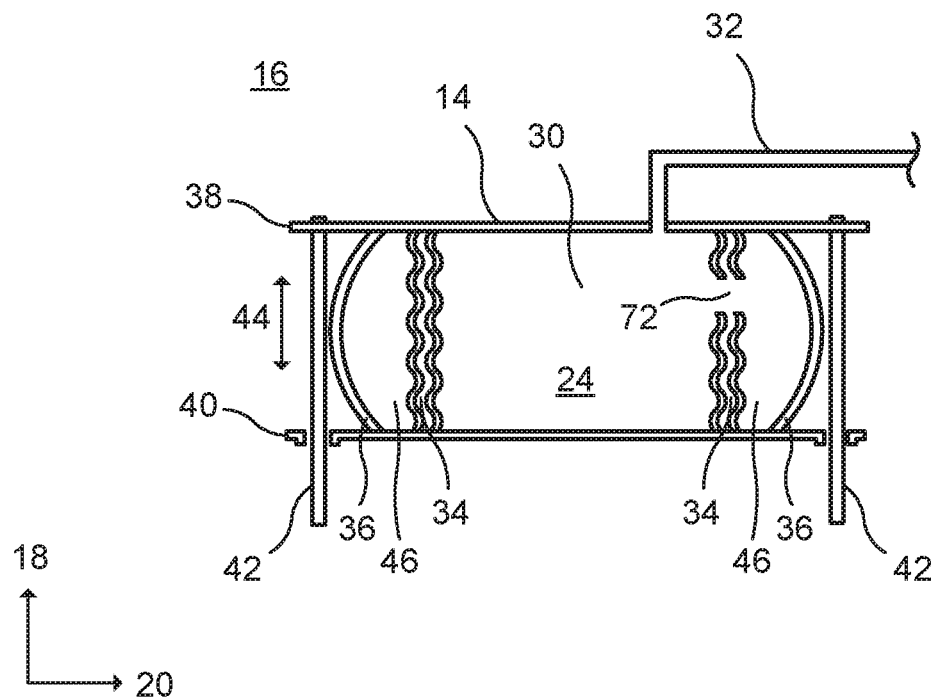
FIG. 7: schematically represents a partial side view of the subsea arrangement when there is a leak in an inner barrier of a pressure compensator.

FIG. 7 schematically represents a partial side view of the subsea arrangement 10 when there is a leak 72 in the inner barrier 34 of the main pressure compensator 14. More specifically, FIG. 7 illustrates the case where there is a leak 72 through both walls of the inner barrier 34.

Although not illustrated in FIG. 7, when there is a leak through only one of the two barriers of the inner barrier 34, no internal fluid 24 will flow between the compensation volume 30 and the intermediate volume 46. In this case, the main pressure compensator 14 will contract and expand according to the volume changes of the internal fluid 24. The spring constant of the main pressure compensator 14 will change when there is a leak through only one of the two barriers of the inner barrier 34. This change of the spring constant, which is more significant when the pressure of the ambient fluid 16 is high, can be detected by measuring a pressure of the internal fluid 24 according to the present disclosure.

When there is a leak 72 through both walls of the inner barrier 34 as illustrated in FIG. 7, a fluid communication between the compensation volume 30 and the intermediate volume 46 will be established. Thereby, the pressure of the internal fluid 24 within both the compensation volume 30 and within the intermediate volume 46 will be equal, i.e., substantially the same as the pressure of the ambient fluid 16 outside of the main pressure compensator 14. The spring constant of the main pressure compensator 14 will change and will no longer correspond to the spring constant of the inner barrier 34, as during normal operation of the subsea arrangement 10. Instead, after the leak in the inner barrier 34, the main pressure compensator 14 will stop moving and the spring constant will initially correspond to the spring constant of the outer barrier 36. Smaller volume variations of the compensation volume 30 will thus be absorbed by radial movements of the outer barrier 36. When the outer barrier 36 reaches its maximum elongation, further volume increases will be absorbed by axial elongation of the main pressure compensator 14, i.e., movements of the upper end plate 38 relative to the lower end plate 40.

The subsea arrangement 10 may withstand breach of the inner barrier 34 at least for a limited time. However, in case of breach of the outer barrier 36, the ambient fluid 16, such as seawater, will eventually enter the main enclosure volume 22 and come in contact with the power equipment 26. This would lead to a costly failure of the subsea arrangement 10.

Figure 8:
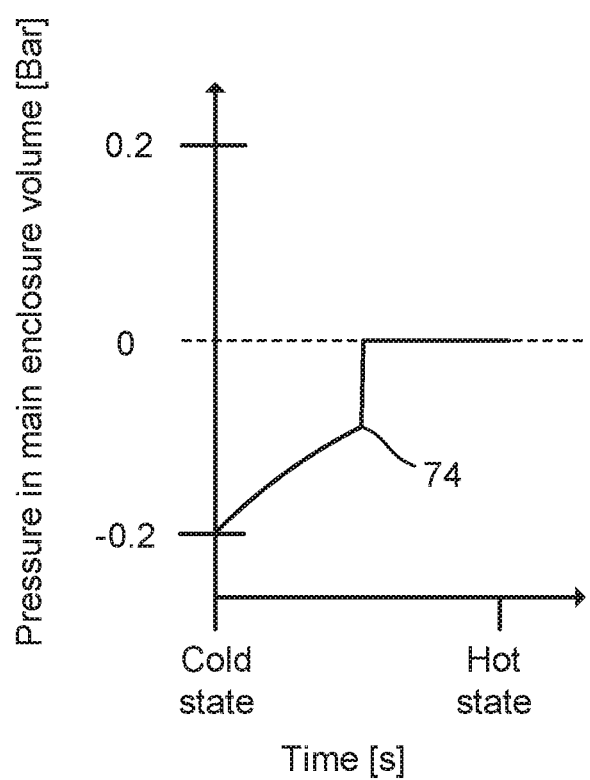
FIG. 8: schematically represents a graph of a typical pressure of an internal fluid in an enclosure volume as a function of time when there is a leak in the inner barrier of the pressure compensator.
Figure 9:
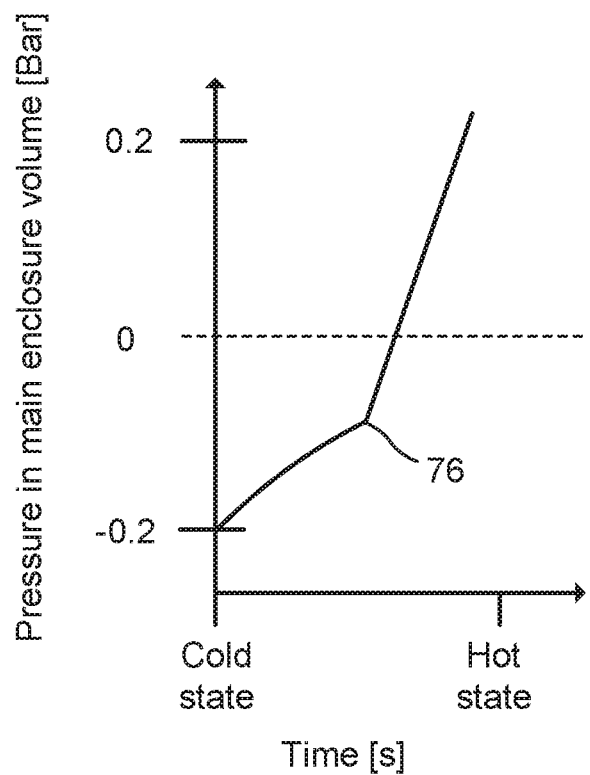
FIG. 9: schematically represents a graph of a typical pressure of an internal fluid in an enclosure volume as a function of time when the pressure compensator is jamming.

FIGS. 8 and 9 show examples of malfunctions of the subsea arrangement 10 that may be detected based on the pressure measurements of the internal fluid 24. Also regarding FIGS. 8 and 9, it is emphasized that the pressure values are merely examples and do not limit the present disclosure. FIG. 8 schematically represents an exemplifying graph of a differential pressure between the pressure of the internal fluid 24 in the main enclosure volume 22 and in the compensation volume 30 and the pressure of the ambient fluid 16 as a function of time when a leak occurs in the inner barrier 34 of the main pressure compensator 14. Point 74 of the graph in FIG. 8 shows when the leak occurs. Due to the leak, the internal fluid 24 in the compensation volume 30 will be brought in fluid communication with the internal fluid 24 in the intermediate volume 46. As a consequence, the pressure of the internal fluid 24 in the main enclosure volume 22 and in the compensation volume 30 will rapidly approach the pressure of the ambient fluid 16 outside of the subsea arrangement 10.

The control system 48 is configured to detect the leakage of the internal fluid 24 from the compensation volume 30 to the intermediate volume 46 when the spring constant derived from the measured pressure profile corresponds to the spring constant of the outer barrier 36. By monitoring the pressure of the internal fluid 24 in this manner, a breach of one barrier, i.e., the inner barrier 34 in this case, can be detected.

FIG. 9 schematically represents an exemplifying graph of a differential pressure between the pressure of the internal fluid 24 in the main enclosure volume 22 and in the compensation volume 30 and the pressure of the ambient fluid 16 as a function of time when the main pressure compensator 14 is jamming. Point 76 of the graph in FIG. 9 shows when the jamming of the main pressure compensator 14 occurs. The jamming of the main pressure compensator 14 can be detected both by a deviation from the normal pressure profile as shown in FIG. 6 and by a changing spring constant of the main pressure compensator 14. A current spring constant of the main pressure compensator 14 may be derived by knowing (or measuring or calculating) temperatures of the internal fluid 24 and consequential volumes of the internal fluid 24 at least two points in time as well as the corresponding pressures of the internal fluid 24. By monitoring the pressure of the internal fluid 24, a jamming of the main pressure compensator 14 can be detected by the control system 48.

In comparison with prior art solutions for monitoring the compensator position, e.g., by means of LVDT transducers, the use of at least one pressure sensor 28 arranged to measure a pressure of the internal fluid 24 provides better granularity on the readings since the readings will not be subjected to inertial and stiction of the main pressure compensator 14, which is the case when measuring compensator position by means of LVDT transducers. Moreover, prior art LVDT transducers will only register when the compensator has started to move. The same applies when visually inspecting the compensator, e.g., by an ROV. In contrast, the subsea arrangement 10 and the method for detecting a malfunction of a subsea arrangement 10 according to the present disclosure can detect a pressure buildup of the internal fluid 24 before the at least one main pressure compensator 14 has started to move.

The subsea arrangement 10 and the method for detecting a malfunction of a subsea arrangement 10 according to the present disclosure can thereby detect a malfunction in a simple, reliable and cheap manner at an early stage of the malfunction. Thereby, a measure to eliminate the malfunction of the subsea arrangement 10 such as maintenance and/or a measure to stop operation of the subsea arrangement 10 can be taken at an earlier stage of the malfunction, e.g., to reduce downtime and/or avoid damage of the subsea arrangement 10. This improves the life cycle cost of the subsea arrangement 10.

Due to the at least one pressure sensor 28 arranged to measure a pressure of the internal fluid 24, pressure fluctuations caused by compression and expansion of the at least one main pressure compensator 14 can be utilized to monitor the condition of the barriers. In case of a leakage, the pressure of the internal fluid 24 will change and this phenomenon can be exploited to detect various types of malfunctions of the subsea arrangement 10, such as leakages or jamming of the at least one main pressure compensator 14.

While the present disclosure has been described with reference to exemplary embodiments, it will be appreciated that the present invention is not limited to what has been described above. For example, it will be appreciated that the dimensions of the parts may be varied as needed. Accordingly, it is intended that the present invention may be limited only by the scope of the claims appended hereto.

What is claimed is:

1. A subsea arrangement comprising:
   a main enclosure having a main enclosure volume;
   at least one main pressure compensator having a variable compensation volume in fluid communication with the main enclosure volume and configured to compensate volume variations of an internal fluid in the main enclosure volume;
   at least one pressure sensor arranged to measure a pressure of the internal fluid; and
   a control system configured to detect a malfunction of the subsea arrangement based on a deviation of the pressure of the internal fluid measured by the at least one pressure sensor from a normal pressure profile;
   wherein the control system is configured to categorize the type of malfunction based on the deviation of the pressure of the internal fluid.

2. The subsea arrangement according to claim 1, wherein the control system is configured to define the normal pressure profile based on historical data of the pressure of the internal fluid and/or calculate the normal pressure profile based on at least one parameter of the subsea arrangement during normal operation of the subsea arrangement.

3. The subsea arrangement according to claim 2, wherein the main pressure compensator includes an inner barrier defining the compensation volume and an outer barrier defining an intermediate volume between the inner barrier and the outer barrier.

4. The subsea arrangement according to claim 1, wherein the main pressure compensator includes an inner barrier defining the compensation volume and an outer barrier defining an intermediate volume between the inner barrier and the outer barrier.

5. The subsea arrangement according to claim 4, wherein the control system is configured to detect a leakage of the internal fluid from the compensation volume to the intermediate volume based on the deviation of the pressure of the internal fluid measured by the at least one pressure sensor from the normal pressure profile.

6. The subsea arrangement according to claim 1, wherein the control system is configured to detect jamming of the main pressure compensator based on the deviation of the pressure of the internal fluid measured by the at least one pressure sensor from the normal pressure profile.

7. The subsea arrangement according to claim 1, further including a termination enclosure adjacent to the main enclosure, the termination enclosure having a termination volume and at least one termination pressure compensator in fluid communication with the termination volume and being configured to compensate volume variations of an internal fluid in the termination volume.

8. The subsea arrangement according to claim 7, wherein the control system is configured to detect leakage of the internal fluid from the main enclosure volume to the termination volume based on the deviation of the pressure of the internal fluid measured by the at least one pressure sensor from the normal pressure profile.

9. The subsea arrangement according to claim 1, wherein the at least one pressure sensor is arranged to measure a pressure of the internal fluid during normal operation of the subsea arrangement.

10. The subsea arrangement according to claim 1, wherein the at least one pressure sensor is configured to measure an absolute pressure of the internal fluid.

11. The subsea arrangement according to claim 1, wherein the at least one pressure sensor is positioned within the main enclosure volume or within the compensation volume.

12. The subsea arrangement according to claim 1, wherein the at least one pressure sensor is an internal pressure sensor; wherein the subsea arrangement further includes at least one external pressure sensor for measuring a pressure of an ambient fluid outside of the main enclosure; and wherein the internal pressure sensor and the external pressure sensor are arranged to measure a differential pressure between the internal fluid and the ambient fluid.

13. The subsea arrangement according to claim 1, wherein the at least one main pressure compensator includes or is constituted by a metal bellows.

14. A method for detecting a malfunction of a subsea arrangement, the subsea arrangement comprising a main enclosure having a main enclosure volume, and at least one main pressure compensator having a variable compensation volume in fluid communication with the main enclosure volume and configured to compensate volume variations of an internal fluid in the main enclosure volume, the method comprising:
measuring a pressure of the internal fluid;
comparing the measured pressure of the internal fluid with a normal pressure profile;
determining a malfunction of the subsea arrangement if the measured pressure of the internal fluid deviates from the normal pressure profile;
categorizing the type of malfunction based on the deviation of the pressure of the internal fluid.

15. The method of claim 14, further including:
defining the normal pressure profile based on historical data of the pressure of the internal fluid during normal operation of the subsea arrangement; and/or
calculating the normal pressure profile based on at least one parameter of the subsea arrangement during normal operation of the subsea arrangement.

16. A computer program product comprising a computer readable means holding computer-executable components for causing a control system to perform a method for detecting a malfunction of a subsea arrangement, the subsea arrangement comprising a main enclosure having a main enclosure volume, and at least one main pressure compensator having a variable compensation volume in fluid communication with the main enclosure volume and configured to compensate volume variations of an internal fluid in the main enclosure volume, the method comprising:
measuring a pressure of the internal fluid;
comparing the measured pressure of the internal fluid with a normal pressure profile;
determining a malfunction of the subsea arrangement if the measured pressure of the internal fluid deviates from the normal pressure profile; and
categorizing the type of malfunction based on the deviation of the pressure of the internal fluid.

17. The computer program product of claim 16, wherein the method further includes:
defining the normal pressure profile based on historical data of the pressure of the internal fluid during normal operation of the subsea arrangement; and/or
calculating the normal pressure profile based on at least one parameter of the subsea arrangement during normal operation of the subsea arrangement.

18. A computer program comprising computer program code which is able to, when run on processor circuitry of a control system, cause the control system to perform a method for detecting a malfunction of a subsea arrangement, the subsea arrangement comprising a main enclosure having a main enclosure volume, and at least one main pressure compensator having a variable compensation volume in fluid communication with the main enclosure volume and configured to compensate volume variations of an internal fluid in the main enclosure volume, the method comprising:
measuring a pressure of the internal fluid;
comparing the measured pressure of the internal fluid with a normal pressure profile;
determining a malfunction of the subsea arrangement if the measured pressure of the internal fluid deviates from the normal pressure profile; and
categorizing the type of malfunction based on the deviation of the pressure of the internal fluid.

* * * * *